United States Patent
Mattos et al.

(10) Patent No.: US 6,292,766 B1
(45) Date of Patent: Sep. 18, 2001

(54) SIMULATION TOOL INPUT FILE GENERATOR FOR INTERFACE CIRCUITRY

(75) Inventors: Derwin Mattos, Sunnyvale; Henry Jen, Hayward; Saeid Moshkelani, San Jose, all of CA (US)

(73) Assignee: VLSI Technology, Inc., San Jose, CA (US)

( * ) Notice: Subject to any disclaimer, the term of this patent is extended or adjusted under 35 U.S.C. 154(b) by 0 days.

(21) Appl. No.: 09/216,385

(22) Filed: Dec. 18, 1998

(51) Int. Cl.$^7$ .................................................. G06F 17/50
(52) U.S. Cl. ............................ 703/14; 703/15; 706/921; 345/964
(58) Field of Search ....................... 703/14, 15; 706/920, 706/921, 94; 716/12; 345/964

(56) References Cited

U.S. PATENT DOCUMENTS

| | | | |
|---|---|---|---|
| 5,278,770 | * | 1/1994 | Gore et al. ............................... 703/14 |
| 5,699,264 | * | 12/1997 | Nakamura et al. ....................... 716/6 |
| 5,781,760 | * | 7/1998 | Winter et al. ............................ 703/14 |
| 5,790,436 | * | 8/1998 | Chen et al. ............................... 716/5 |
| 5,933,356 | * | 8/1999 | Rostoker et al. ....................... 703/15 |

OTHER PUBLICATIONS

Li et al. "Automated Extraction of Parasitic BJTs from CMOS I/O Circuits Under ESD Stress", International Integrated Reliability Workshop Final Report, pp. 103–109, Oct. 1997.*

Tehrani et al., "Extraction of Transient Behavioral Model of Digital I/O Buffers from IBIS", Proceedings of the 46th Electronic Components and Tech. Conf., pp. 1009–1015, May 1996.*

Cuny, R. H. G., "SPICE and IBIS Modeling Kits the Basis for Signal Integration Analyses", IEEE Intern. Symp. on Electromagnetic Compatibility, pp. 204–208, Aug. 1996.*

Ying et al., "The Development of Analog SPICE Behavioral Model Based on IBIS Model", Proceedings Ninth Great Lakes Symp. on VLSI, pp. 101–104, Mar. 1999.*

Shi et al., "Simulation and Measurement for Decoupling on Multilayer DC Power Buses", IEEE 1996 International Symposium on Electromagnetic Compatibility, pp. 430–435, Aug. 1996.*

* cited by examiner

Primary Examiner—Kevin J. Teska
Assistant Examiner—Douglas W. Sergent
(74) Attorney, Agent, or Firm—Wagner, Murabito & Hao LLP

(57) ABSTRACT

The present invention is a simulation tool input file generator implemented in a computer system that permits a designer to efficiently and effectively create and modify electrical circuit simulation tool input files. The simulation tool input file generator permits a user to conveniently enter high level circuit description information in user friendly formats such as an easy to use GUI. Based upon the information provided by a user, the present invention assembles data including circuit description files stored in a memory and produces a detailed simulation tool input files.

13 Claims, 23 Drawing Sheets

| | pc3b01c.flr | |
|---|---|---|
| 1 | | pv3i |
| 2 | | pt6o05c |
| 3 | | pt6o05c |
| 4 | | pt6o05c |
| 5 | | pt6o05c |
| 6 | | pv0e |
| 7 | | pv3e |
| 8 | | pt6o05c |
| 9 | | pt6o05c |
| 10 | | pt6o05c |
| 11 | | pt6o05c |
| 12 | | pv0e |
| 13 | | pv3e |
| 14 | | pt6o05c |
| 15 | | pt6o05c |
| 16 | | pt6o05c |
| 17 | | pt6o05c |
| 18 | | pv0e |
| 19 | | pv3e |
| 20 | | pt6o05c |
| 21 | | pt6o05c |
| 22 | | pt6o05c |
| 23 | | pt6o05c |
| 24 | | StaticCkt |
| 25 | | pt6o05c |
| 26 | | pt6o05c |
| 27 | | pt6o05c |
| 28 | | pt6o05c |
| 29 | | pv0e |
| 30 | | pv3e |
| 31 | | pt6o05c |
| 32 | | pt6o05c |
| 33 | | pt6o05c |
| 34 | | pt6o05c |
| 35 | | pv0e |
| 36 | | pv3e |
| 37 | | pt6o05c |
| 38 | | pt6o05c |
| 39 | | pt6o05c |
| 40 | | pt6o05c |
| 41 | | pv0e |
| 42 | | pv3e |
| 43 | | pt6o05c |
| 44 | | pt6o05c |
| 45 | | pt6o05c |
| 46 | | pt6o05c |
| 47 | | pv0i |

FIGURE 4

Exemplary I/O buffer circuit description file pt6o05c

.subckt pt6o05c In Pad VCC VCCE VSS VSSE VDD
M1ND NG NB MNAME L=Value W=Value....TEMP=Value
C2 N1 N2 Value....IC=Value
R4 N1 N2 Value
etc.......
.ends pt6o05c

FIGURE 6

| FILE ← 221 | | | 210 | | 222 → HELP |
|---|---|---|---|---|---|
| DESIGN SETUP 231 | IO DEFINITION 232 | LOAD SETUP 233 | SIMULATION CONTROL 234 | OUTPUT RESULTS 235 | 800 |

IO BUFFER INFORMATION 810

PV3D 811    SLOT NAME |SLOT 1  812|    PIN ID |1  813| ▲▼

POWER LINES 820

821→ ☐ VCC ←822    ☐ ←823
☐ VCCA         ☐
☐ VCCAC        ☐
☐ VCCDC        ☐
☐ VCCDCA       ☐
☐ VDD          ☐
☐ VSS          ☐
☐ VSSAC        ☐
☐ VSSACA       ☐
☐ VSSDC        ☐

DATA LINES 830

NAME 831    SIGNAL 832    CAP 833

PIN  |VCC|

| OK 223 | DEFAULT 224 | CANCEL 225 | HELP 226 |
|---|---|---|---|

FIGURE 8

| FILE ← 221 | | 210 | | | 222 → HELP |
|---|---|---|---|---|---|
| DESIGN SETUP 231 | IO DEFINITION 232 | LOAD SETUP 233 | SIMULATION CONTROL 234 | OUTPUT RESULTS 235 | |

IO BUFFER INFORMATION   810

PC3D01   811   SLOT NAME  SLOT 4  812        PIN ID  4   813

POWER LINES   820

- ☐ VCC    ☐
- 826→☐ VCCA ← 827  ☐ ← 828
- ☐ VCCAC   ☐
- ☐ VCCDC   ☐
- ☐ VCCDCA  ☐
- ☐ VDD     ☐
- ☐ VSS     ☐
- ☐ VSSAC   ☐
- ☐ VSSACA  ☐
- ☐ VSSDC   ☐

DATA LINES   830

| NAME 831 | SIGNAL 832 | CAP 833 |
|---|---|---|
| CIN | CIN4 | |
| PIN | PIN4 | |

| OK 223 | DEFAULT 224 | CANCEL 225 | HELP 226 |
|---|---|---|---|

FIGURE 10

| | 210 | |
|---|---|---|
| FILE ← 221 | | 222 → HELP |

| DESIGN SETUP 231 | IO DEFINITION 232 | LOAD SETUP 233 | SIMULATION CONTROL 234 | OUTPUT RESULTS 235 | 300a |

IO BUFFER INFORMATION 810

PC3D01 811  SLOT NAME  LEFT  812  PIN ID  4  813

POWER LINES 820

- ☐ VCC  ☐
- 826→☐ VCCA ← 827  ☐ ← 828
- ☐ VCCAC  ☐
- ☐ VCCDC  ☐
- ☐ VCCDCA  ☐
- ☐ VDD  ☐
- ☐ VSS  ☐
- ☐ VSSAC  ☐
- ☐ VSSACA  ☐
- ☐ VSSDC  ☐

DATA LINES 830

| NAME 831 | SIGNAL 832 | CAP 833 |
|---|---|---|
| CIN | CIN | 10p |
| PIN | left | 5p |

| OK 223 | DEFAULT 224 | CANCEL 225 | HELP 226 |

FIGURE 11

| FILE ← 221 | | | | 210 | | 222 → HELP |
|---|---|---|---|---|---|---|
| DESIGN SETUP 231 | IO DEFINITION 232 | LOAD SETUP 233 | SIMULATION CONTROL 234 | OUTPUT RESULTS 235 | | 1400 |

INTERCONNECT LOAD 1410

| 1411 | L 1412 | R 1413 | | | | |
|---|---|---|---|---|---|---|
| VCC | .05NH | .084 | | | | |
| VCCA | .05NH | .084 | | | | |
| VCCAC | .05NH | .084 | | | | |
| VCCDC | .05NH | .084 | | | | |
| VCCDCA | .05NH | .084 | | | | |
| VDD | .05NH | .084 | | | | |
| VSS | .05NH | .084 | | | | |
| VSSAC | .10NH | .084 | | | | |
| VSSACA | .10NH | .084 | | | | |
| VSSDC | .10NH | .084 | | | | |

PIN PACKAGE LOAD 1420

- L: 5NH 1421
- R: .2 1422
- C: .5PF 1423

| OK 223 | DEFAULT 224 | CANCEL 225 | HELP 226 |
|---|---|---|---|

| | | | | |
|---|---|---|---|---|
| [Model] | pt3t07c ←1810 | | | 1801 |
| Model_type | 3-state ←1811 | | | |
| Polarity | Non-Inverting ←1812 | | | |
| Enable | Active-Low ←1812 | | | |
| Variable | typ | min | max | |
| C_comp | 0 | NA | NA | ←1814 |
| [Temperature Range] | 25.0 | 125 | -40 | ←1815 |
| [Voltage Range] | 3.3 | 3.0 | 3.6 | ←1816 |

| [Pulldown] | | | | 1802 |
|---|---|---|---|---|
| Voltage ←1820 | I(typ) ←1830 | I(min) ←1840 | I(max) ←1850 | |
| -3.300 | -1.85e+00 | -1.61e+00 | -2.10e+00 | |
| -3.200 | -1.78e+00 | -1.55e+00 | -2.01e+00 | |
| -3.100 | -1.70e+00 | -1.48e+00 | -1.92e+00 | |

| [Pullup] | | Vtable = Vcc - Voutput | | 1803 |
|---|---|---|---|---|
| Voltage | I(typ) | I(min) | I(max) | |
| -3.300 | -1.47e+00 | -1.42e+00 | -1.46e+00 | |
| -3.200 | -1.41e+00 | -1.37e+00 | -1.38e+00 | |
| -3.100 | -1.35e+00 | -1.32e+00 | -1.31e+00 | |

| [GND Clamp] | | | | 1804 |
|---|---|---|---|---|
| Voltage | I(typ) | I(min) | I(max) | |
| -1.150 | -9.120e-002 | NA | NA | |
| -1.100 | -7.671e-002 | NA | NA | |
| -1.050 | -6.288e-002 | NA | NA | |

| [Ramp] | ←1871 | ←1872 | ←1873 | 1805 |
|---|---|---|---|---|
| Variable | typ | min | max ←1874 | |
| dV/dt_r | 1.52e+00/3.47e-10 | 1.20e+00/6.26e-10 | 1.83e+00/2.56e-10 | |
| dV/dt_f | 1.70e+00/3.64e-10 | 1.35e+00/6.73e-10 | 1.98e+00/2.62e-10 | |

[Rising Waveform] ←1881
R_fixture = 0
V_fixture = 3.3

|  | 1805 |  |  |  |
|---|---|---|---|---|
| Time ← 1882 | V(typ) ← 1883 | V(min) ← 1884 | V(max) ← 1885 |  |
| 0. | 0.000 | 0.000 | 0.000 |  |
| 1.00e-10 | 0.000 | 0.000 | 0.000 |  |
| 2.00e-10 | 0.000 | 0.000 | 0.000 |  |
| 3.00e-10 | 0.000 | 0.000 | 0.000 |  |

[Falling Waveform] ← 1891
R_fixture = 0
V_fixture = 0

| Time ← 1892 | V(typ) ← 1893 | V(min) ← 1894 | V(max) ← 1895 |
|---|---|---|---|
| 0. | 3.300 | 2.900 | 3.600 |
| 1.00e-10 | 3.300 | 2.900 | 3.600 |
| 2.00e-10 | 3.300 | 2.900 | 3.600 |
| 3.00e-10 | 3.300 | 2.900 | 3.600 |

| *IO Buffers Netlist | 1910 |
| --- | --- |

Xslot1   PAD1 VCC1 VCCE1 VSS1 VSSE1 VDD1 pv2i
Xslot2  I PAD2 VCC2 VCCE2 VSS2 VSSE2 VDD2 pt6o05C
Xslot3  I PAD3 VCC3 VCCE3 VSS3 VSSE3 VDD3 pt6o05c

| *** Power Interconnect Output Section | 1920 |
| --- | --- |

***
*

*Interconnect Slot 2 cell PT6O05C
*

XVCC23 VCC2 VCC3 mvcc L=.07NH R=.211
XVCCE23 VCCE2 VCCE3 mvcce L=.10NH R-.085
XVSS23 VSS2 VSS3 mvss L=.08NH R=.132
XVSSE23 VSSE2 VSSE3 mvsse L=.10NH R=.085
XVDD23 VDD2 VDD3 mvdd L=.05NH R=.314

| *** Package Pin Load | 1930 |
| --- | --- |

***

Xpad1 Pad1 VDD mpin  L=5NH R=.2 C=.5PF
Xpad2 Pad2 PIN2 mpin  L=5NH R=.2 C=.5PF
Xpad3 Pad3 PIN3 mpin  L=5NH R=.2 C=.5PF
Xpad4 Pad4 PIN4 mpin  L=5NH R=.2 C=.5PF
Xpad5 Pad5 PIN5 mpin  L=5NH R=.2 C=.5PF

| *Pin Capacitances | 1940 |
| --- | --- |

***

CPIN2 PIN2 0 50p
CPIN3 PIN3 0 50p
CPIN4 PIN4 0 50p
CPIN5 PIN5 0 50p

| *User Voltage sources | 1950 |
| --- | --- |

*

*Voen oen vss 0
*Voens oenS vss 0
vtest   iS 0 pwl (0ns vdd 70ns vdd 80ns 0V 202ns 0V)
*input waveform
vsource 600 0 pulse (vdd 0V 2ns .5ns .5ns 100ns 202ns)
xinputpin1 601 600 mpin
xinputpin2 601 600 mpin
xinputpin3 601 600 mpin
rinput     601 602 20
Mp i 602 vdd vdd p L=.50u W=1000u
Mn i 602 0 0 n L=.50u W=500u
.param lowmax=70n highmin=90n
.param pttltarg=1.4
.param vcc=3 .6V
.param vdd=2 .75V

```
*Process Information                                              1950
.temp -40
.option search ="/actlibs/io0/vsc8p38/development/inc"
.include '/vlsi/v8r4.9/tec/vcmn4. inc'
.lib '/vlsi/v8r4.9/tec/vcmn4.lib' FF

*Tran Statement
.tran 0.1n 200n
.option post fast

*Power Supplies Informtion
VVCC VCC 0 vcc
VVDD VDD 0 vdd
VVSS VSS 0 0.0
```

**FIGURE 19
(CONT.)**

SIMULATION TOOL INPUT FILE GENERATOR FOR INTERFACE CIRCUITRY

FIELD OF THE INVENTION

The present invention relates to the field of electrical circuit simulation tools. More particularly, the present invention relates to a simulation tool input file generator that constructs input files for performing design analysis of electrical circuits such as input/output buffer rings in a microelectronic chip.

BACKGROUND OF THE INVENTION

Electronic technologies such as digital computers, calculators, audio devices, video equipment and telephone systems have facilitated increased productivity and reduced costs in a number of activities, including the analysis and communication of data, ideas and trends in most areas of business, science, education, and entertainment. There are a number of different complex electronic systems and circuits that have contributed to the realization of these benefits. These electronic systems and circuits usually have complicated configurations that require substantial resources be expended to optimize a design.

Designing complex electronic systems and circuits requires arduous analysis of numerous electrical characteristics, including the performance of extensive calculations and manipulation of complicated electrical principles of physics. Typically an analysis becomes even more complex when designers attempt to integrate numerous electronic components on a single integrated circuit chip, giving rise to a variety of factors requiring careful review and attention. For example, microelectronic chips typically manipulate and process signals that are adversely affected by noise. Negative noise impacts in input/output (IO) buffer circuits are usually generated by inductance and can typically be overcome or reduced by incorporating more power and ground IO buffer circuit connections to a chip. However, adding power and ground IO buffer circuit connections to a chip takes up precious chip space and expends valuable placement resources. Thus, a chip designer usually tries to reach an optimal balance in which there are a minimum number of power and ground IO buffer circuit connections taking up valuable chip space while at the same time ensuring there are enough power and ground IO buffer circuit connections to prevent noise interference from exceeding an acceptable level.

Analyzing potential noise interference in an IO buffer circuit is typically complicated by a variety of factors. Usually, there are numerous IO buffer circuits in a chip and the sheer quantity result in the expenditure of significant resources to analyze noise contributions in IO buffer circuits. This large quantity of IO buffer circuits usually comprises a variety of switching configurations that have different electrical characteristics for each specific load. A number of internal and external electrical characteristics, such as resistance, capacitance, inductance, mutual inductance, etc., contribute to noise generation and its adverse affects on a signal in an IO buffer circuit. An analysis of noise in IO buffer circuits should be performed dynamically in a manner that is cognizant of affects resulting from internal and external changes in electrical characteristics and the relative location of one IO buffer to other IO buffers. Thus, the complexity of an accurate analysis of adverse impacts due to noise interference in an IO buffer circuit requires significant resources.

Engineers regularly rely on computer aided engineering (CAE) design tools to assist with many of the complicated manipulations, computations and analyses that are required to design electronic circuits, especially when a part of the design is integrated on an integrated chip. Some CAE design tools are general-purpose simulation software programs that perform such functions as nonlinear DC analysis, nonlinear transient analysis, and linear AC analysis of electrical signals, while others are directed more to specific types of analysis. Circuits being designed or analyzed usually include resistors, capacitors, inductors, voltage and current sources, switches, uniform distributed RC lines, and common semiconductor devices such as bipolar junction transistors (BJT), junction field effect transistors (JFET), metal oxide surface field effect transistors (MOSFET), etc. A good analysis typically involves a review of numerous electrical characteristics associated with each component.

Analyzing an electronic system or circuit with multiple simulation tools usually provides better results and greater insight into performance abilities than a single simulation tool can provide. Typically different simulation tool families provide different benefits. For example, two common simulation software tools include simulation programs with integrated circuit emphasis (SPICE) and input/output buffer information specifications (IBIS). SPICE and IBIS simulation tools provide different advantages.

SPICE tools typically permit detailed electrical analysis of circuits including integrated circuit chips. For example, SPICE simulators are capable of performing device generated noise analysis for a given circuit including IO buffer circuits. For every frequency point in a specified range, a SPICE simulator is capable of calculating a value of the noise corresponding to a spectral density of a circuit variable viewed as a stationary gaussian stochastic. After calculating spectral densities, the values are integrated over the specified frequency range to arrive at the total noise voltage/current.

IBIS descriptions provide a "black box" behavioral model of an IO buffer circuit. Direct current versus voltage (IN) curves, rise and fall time, and packaging information are fed into an IBIS simulation tool. IBIS simulations are advantageous for a number of reasons including being well suited for simulating an entire electronic system of several hundred nets and drivers, presenting signal integrity or flight-time information in a relatively practical manner and quickly completing simulations.

Although electrical circuit simulation tools typically provide some assistance to engineers in designing and analyzing circuits, a sizable amount of valuable resources are expended in preparing for simulation operations, particularly the generation of simulation tool input files. In particular, performing advanced analysis of a circuit with simulation tools usually requires exorbitant amount of resources be expended, creating a complicated and lengthy input files. Generation of extensive input files in a manner that is compatible with a simulation tool usually requires a lot of error prone manual entries. Additional human resources are required to check that data is correctly typed into a computer by hand in appropriate entry locations associated with a particular simulation tool input file format. The difficulty of generating or altering an input file is compounded by the fact that simulation tool input files are typically in an inconvenient format that is somewhat difficult to read and comprehend. The input files for most simulation tools are so complex that it is usually not economical to generate a detailed electrical description of a chip's interface circuitry in a manner that permits detailed signal integrity analysis and characterization of internal and external signals in one simulation session.

Accordingly, what is required is a system and method that permits a designer to efficiently and effectively create and modify electrical circuit simulation tool input files. The system and method should enable a user to convey information conveniently in a manner that minimizes the amount of data a user has to enter manually to adequately describe features of the circuit being designed or analyzed. The system and method should allow a user to easily modify design features without manually modifying the entire simulation input file. Simulation tool input files provided by the system and method should include electrical component description simulation tool input files and electrical characteristic description simulation tool input files such as SPICE formatted input files and IBIS formatted input files. These simulation input files should permit detailed signal integrity analysis and characterization of internal and external signals in one simulation session. For example, the system and method should economically generate simulation tool input files of a chip's interface circuitry in a manner that allows the use of simulation tools to design and analyze an IO buffer circuit ring integrated on an electronic chip. The present invention provides these advantageous features.

SUMMARY OF THE INVENTION

The present invention is a system and method that permits a designer to efficiently and effectively create and modify electrical circuit simulation tool input files. The system and method enables a user to conveniently convey information in a manner that minimizes the amount of data a user has to manually enter while adequately describing features of the circuit being designed or analyzed. It allows a user to easily modify design features without manually modifying the entire simulation input file and is capable of producing electrical component description simulation tool input files and electrical characteristic description simulation tool input files. The present invention is capable of providing simulation input files with enough information to permit detailed signal integrity analysis and characterization of internal and external signals in one simulation session. For example, the system and method economically generates simulation tool input files of a chip's interface circuitry in a manner that allows the use of SPICE and IBIS simulation tools to design and analyze an IO buffer circuit ring integrated on an electronic chip.

In one embodiment of the present invention, an electrical circuit simulation tool input file generator is implemented in a computer system. The input file generator includes a user friendly graphical interface for selecting circuit description files and modifying values assigned to fields in an instance of the circuit description file. Detailed input files compatible with simulation tool formats are generated by the present invention and automatically populated with appropriate values for electrical characteristics based upon referenced circuit description files and special user modification notations.

DESCRIPTION OF THE DRAWINGS

The accompanying drawings which are incorporated in and form a part of this specification, illustrate embodiments of the invention and together with the description, serve to explain the principles of the invention:

FIG. 4 is an example of a floor plan file setting forth an input/output buffer circuit floor plan for a chip in accordance with the present invention.

FIG. 6 is an exemplary IO buffer circuit description file in accordance with the present invention, which in the particular embodiment shown is an output only buffer circuit.

FIG. 8 shows IO definition subwindow in accordance with the present invention illustrating information regarding IO buffer circuit in slot 1 of a chip.

FIG. 10 is an illustration of IO definition subwindow in accordance with the present invention for slot 4 of a electrical chip.

FIG. 11 is an illustration of IO definition subwindow in accordance with the present invention for slot 4 of a chip selected after a user has deselected some lines by clicking on right connection indicators.

FIG. 14 illustrates load setup subwindow in accordance with the present invention depicting values assigned to internal electrical characteristics of buses coupled to IO buffer circuits.

FIG. 18 is a partial listing of an IBIS model file included in a library of electrical characteristic models folder in accordance with the present invention.

FIG. 19 is a partial listing of a SPICE simulation tool input file.

BEST MODE FOR CARRYING OUT THE INVENTION

Figure 1A:
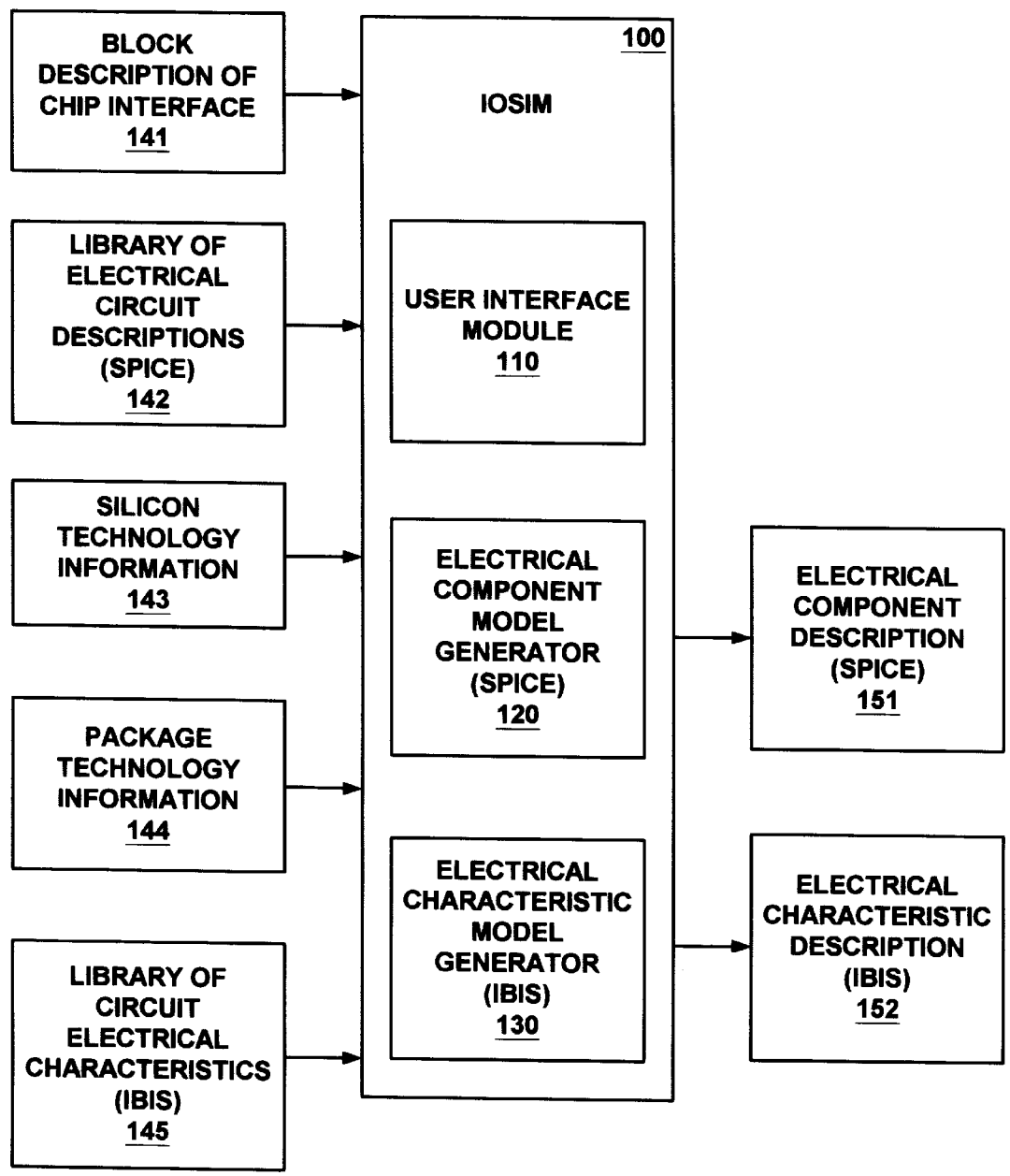
FIG. 1A is a block diagram representation of one embodiment of the present invention.

Reference will now be made in detail to the preferred embodiments of the invention, a simulation tool input file generator, examples of which are illustrated in the accompanying drawings. While the invention will be described in conjunction with the preferred embodiments, it will be understood that they are not intended to limit the invention to these embodiments. On the contrary, the invention is intended to cover alternatives, modifications, and equivalents, which may be included within the spirit and scope of the invention as defined by the appended claims.

Furthermore, in the following detailed description of the present invention, numerous specific details are set forth in order to provide a thorough understanding of the present invention. However, it will be obvious to one ordinarily skilled in the art that the present invention may be practiced without these specific details. In other instances, well known methods, procedures, components, and circuits have not been described in detail as not to unnecessarily obscure aspects of the current invention.

Some portions of the detailed descriptions which follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. A procedure, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention permits a designer to efficiently and effectively create and modify electrical circuit simulation tool input files. The present system and method enables a user to convey information conveniently in a manner that minimizes the amount of data a user has to enter manually while adequately describing features of the circuit being designed or analyzed. It allows a user to easily modify design features without manually modifying the entire simulation input file. The present invention provides electrical component description simulation tool input files and electrical characteristic description simulation input files such as SPICE formatted sub-circuit description files and IBIS formatted input files. The simulation tool input files generator of the present invention is capable of providing detailed files sufficient for use in signal integrity analysis and characterization of internal and external signals in one simulation session. For example, the system and method of the present invention economically generates simulation input files of an integrated circuit chip's interface circuitry in a manner that allows the use of simulation tools to design and analyze an IO buffer circuit ring.

FIG. 1A is a logical block diagram of a system 109 including one embodiment of the present invention IOSim 100. IOSim 100 is a software program operating on a computer system including a processor coupled to a bus and a memory coupled the bus. In another embodiment, operations of IOSim 100 are implemented in hardware. IOSim 100 comprises a user interface module 110, electrical component model generator 120 and electrical characteristic (e.g. IBIS) model generator 130. IOSim 100 is coupled to various description file folders comprising a block description of chip interface folder 141, library of electrical circuit description folder 142, silicon technology information folder 143, package technology information folder 144, library of circuit electrical characteristics folder 145, electrical component description folder 151 and electrical characteristic description folder 152.

Generating simulation tool input files within IOSim 100 is typically an iterative process involving both activities performed by IOSim 100 and inputs from a user. IOSim 100 facilitates communications between a user and IOSim 100 in a manner that is described below. Generally, a user begins by defining a design at a high level and setting forth some basic parameters. Based upon the information provided by a user, IOSim 100 retrieves appropriate information from other sources such as library or information folders. IOSim 100 then processes the information and generates a detailed description of a circuit or system being analyzed. Usually there are points in the process at which a user has opportunities to provide additional information or modify the information assembled and arranged by IOSim 100. When a user is satisfied that appropriate information has been incorporated to perform a design analysis, IOSim 100 generates a simulation tool input file.

User interface module 110 of FIG. 1A enables a user to communicate expediently and efficiently with electrical component model generator 120 and electrical characteristic model generator 130. In one embodiment of IOSim 100, user interface module 110 comprises software code that generates an interactive graphical user interface (GUI). The GUI presents information regarding operations of IOSim 100 to the user. In another embodiment, user interface module 110 interprets batch code text rather than relying on GUI input. User interface module 110 conveys information between a user and other components of IOSim 100 in a convenient format that is easier to read and modify relative to a complex simulation tool formatted input text.

Electrical component model generator 120 creates complex electrical component description files based upon information supplied by a user via user interface module 110. Electrical component model generator 120 interprets information and commands transmitted from user interface module 110 and performs complex iterations required to generate an electrical component description simulation input file. For example, electrical component model generator 120 locates and retrieves files identified via a GUI, such as files from block description of chip interface folder 141, library of electrical circuit description folder 142, silicon technology information folder 143, package technology information folder 144, etc. After retrieving identified files, electrical component model generator 120 creates a collection of electrical simulation tool formatted input files in an appropriate arrangement. For example, in one embodiment utilizing SPICE files, electrical component model generator 120 arranges circuit description files in a particular order identified in a floor file retrieved from block description of chip interface folder 141 and creates multiple instances of a circuit description file if required. A floor file is a text file listing names of IO buffer circuit description files in order according to the position of the corresponding IO buffer in an IO interface of an integrated circuit chip. Electrical component model generator 120 also populates these electrical simulation tool formatted files with appropriate data and creates any additional electrical simulation input files required to adequately describe a circuit being analyzed.

Electrical characteristic model generator 130 of FIG. 1 creates complex electrical characteristic description files based upon information supplied by a user via user interface module 110. Electrical characteristic model generator 130 is similar to electrical component model generator 120 except it is concerned with producing electrical characteristic description files instead of electrical component description simulation tool input files. It also interprets information and commands from the GUI in an easy to use format and performs complex iterations directed at forming a board level simulation tool input file. For example, electrical characteristic model generator 130 locates and retrieves files identified by a user via a GUI, arranges electrical characteristic simulation tool formatted files in a specified order, populates these files with appropriate data and creates any additional simulation input files required to adequately describe a circuit to be analyzed. One embodiment of electrical characteristic model generator 130 does not rely on output of electrical component model generator 120 to create electrical characteristic description files, while another embodiment of electrical characteristic model generator 130 does rely in part on the output of electrical component model generator 120 to create electrical characteristic description files.

Figure 1B:
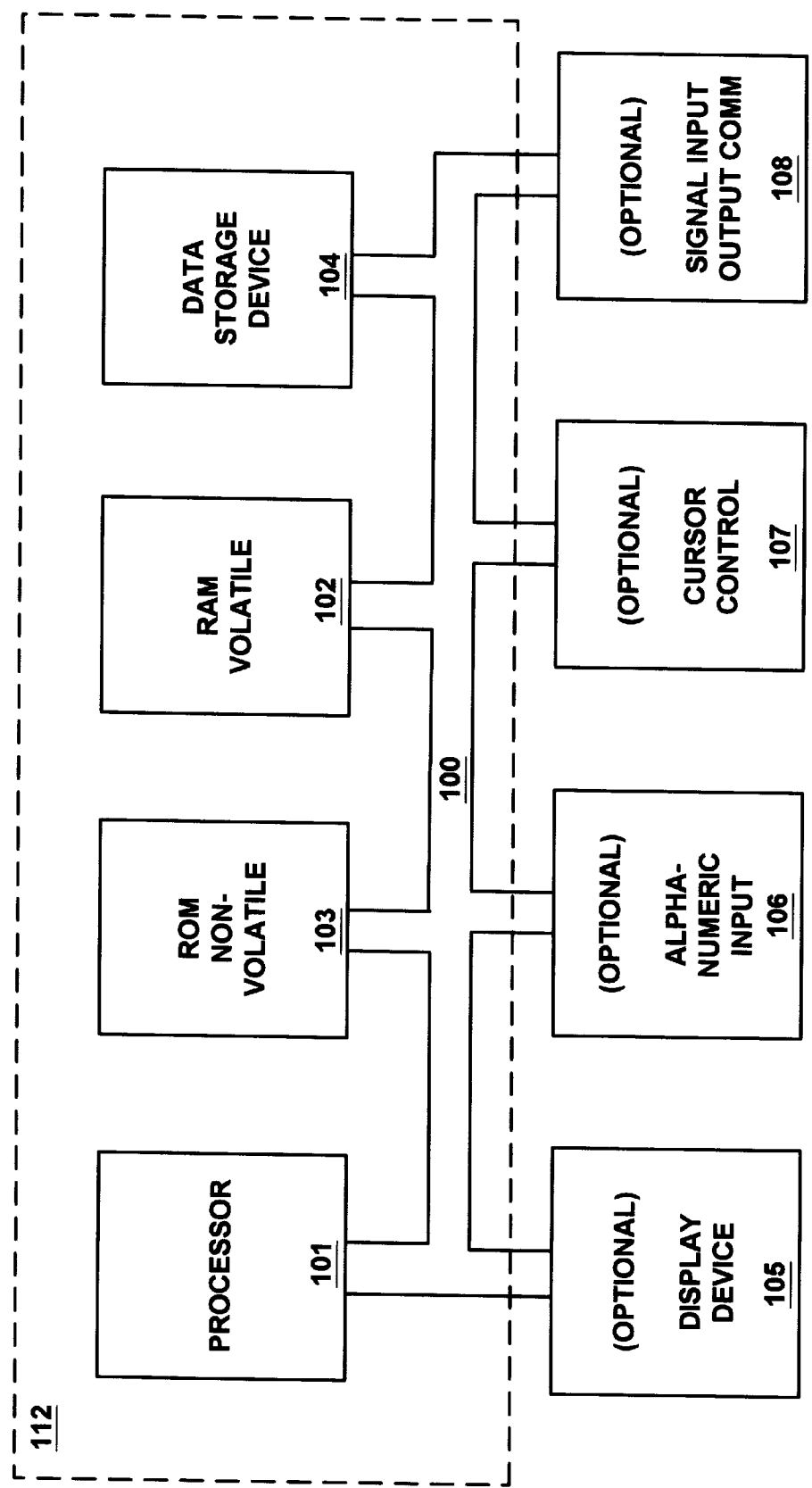
FIG. 1B illustrates a computer system utilized by the present invention.

Refer to FIG. 1B which illustrates a computer system 112. In general, computer systems 112 used by the preferred embodiment of the present invention comprise a bus 100 for communicating information, a central processor 101 coupled with the bus for processing information and instructions, a random access memory 102 coupled with the bus 100 for storing information and instructions for the central processor 101, a read only memory 103 coupled with the bus 100 for storing static information and instructions for the processor 101, a data storage device 104 such as a magnetic or optical disk and disk drive coupled with the bus 100 for storing information and instructions, a display device 105 coupled to the bus 100 for displaying information to the computer user, an alphanumeric input device 106 including alphanumeric and function keys coupled to the bus 100 for communicating information and command selections to the central processor 101, a cursor control device 107 coupled to the bus for communicating user input information and command selections to the central processor 101, and a signal generating device 108 coupled to the bus 100 for communicating command selections to the processor 101.

The display device 105 of FIG. 1B utilized with the computer system 112 of the present invention may be a liquid crystal device, cathode ray tube, or other display device suitable for creating graphic images and alphanumeric characters recognizable to the user. The cursor control device 107 allows the computer user to dynamically signal the two dimensional movement of a visible symbol (pointer) on a display screen of the display device 105. Many implementations of the cursor control device are known in the art including a trackball, mouse, joystick or special keys on the alphanumeric input device 105 capable of signaling movement of a given direction or manner of displacement. It is to be appreciated that the cursor means 107 also may be directed and/or activated via input from the keyboard using special keys and key sequence commands. Alternatively, the cursor may be directed and/or activated via input from a number of specially adapted cursor directing devices.

Figure 2:
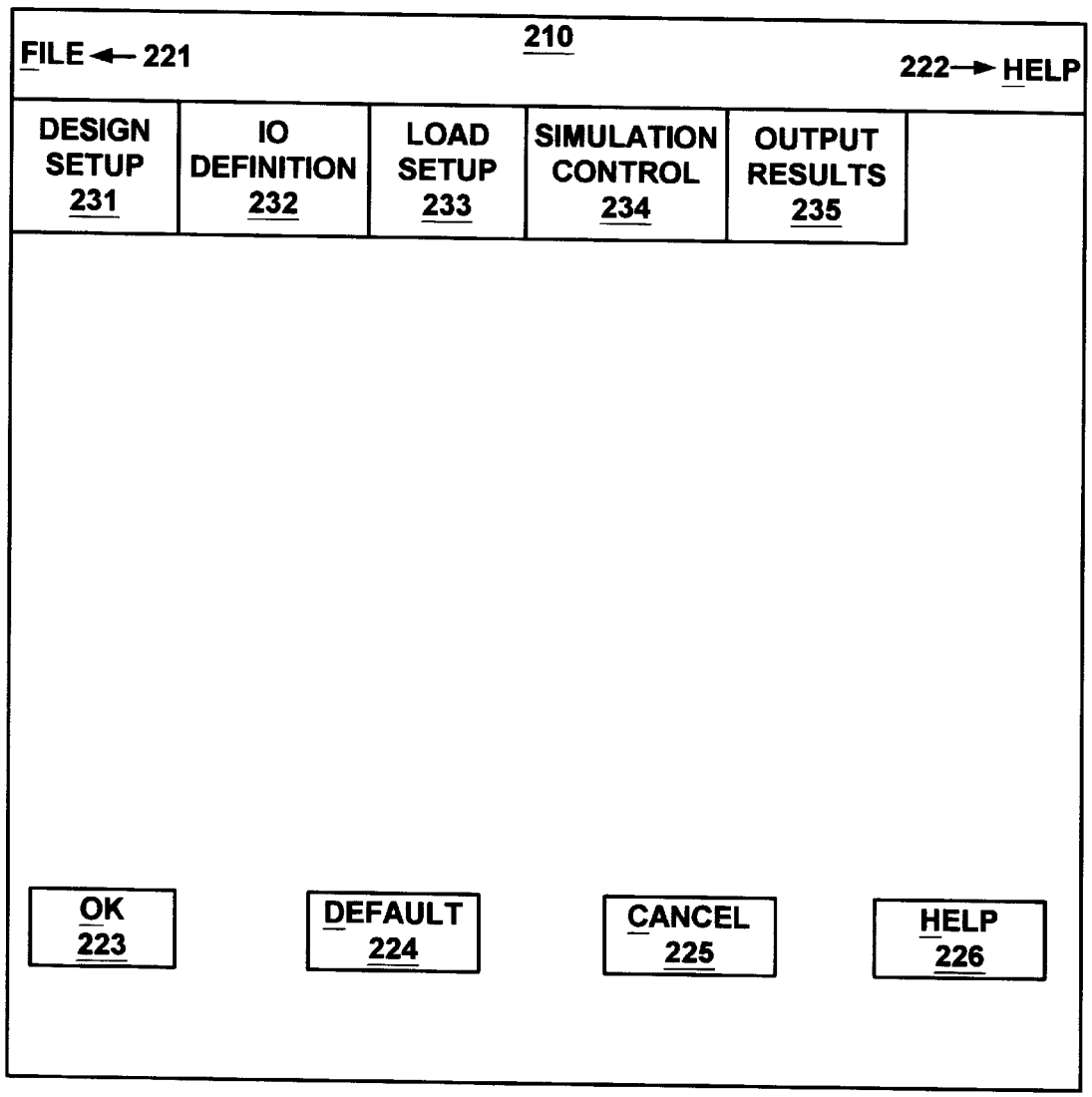
FIG. 2 is an illustration of one embodiment of a graphical user interface generated by a user interface module of the present invention showing a main window.

FIG. 2 shows one embodiment of a GUI generated by user interface module 110. The GUI is presented to a user in a notebook dialogue box format utilizing a main window 210 comprising control buttons and subwindow tabs. The control buttons of main window 210 comprise file button 221, help button 222, OK button 223, default button 224, cancel button 225 and help button 226. The subwindow tabs available in one embodiment of IOSim 100 comprise design setup tab 231, IO definition tab 232, load setup tab 233, simulation control tab 234 and output results tab 235. The control buttons permit a user to direct commands from the GUI to other parts of the computer system, and the tabs permit a user to access subwindows by clicking (e.g. with a cursor directing device) on a different tab to move between subwindows.

Figure 3:
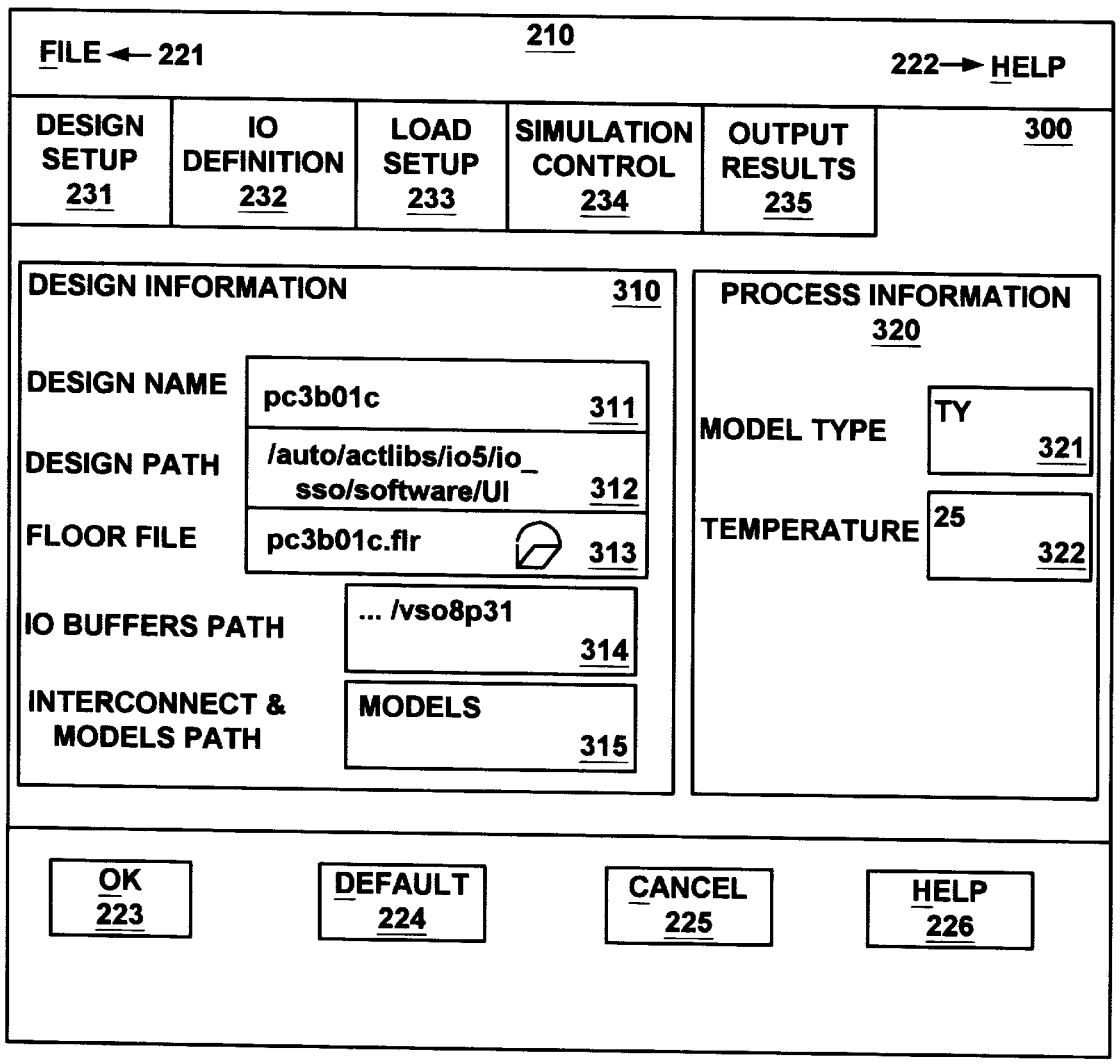
FIG. 3 is an illustration of one embodiment of a GUI displaying a design setup subwindow of the present invention.

Design setup tab 231 permits a user to access a design setup subwindow 300, illustrated in FIG. 3. One embodiment of design setup window 300 is a default subwindow that automatically appears open when main window 210 is initially started. Design setup subwindow 300 of FIG. 3 comprises design information section 310 and process information section 320. Design information section 310 comprises data entry boxes including design name box 311, design path box 312, floor file box 313, IO buffer path box 314, and interconnect & models path box 315. Process information section 320 comprises model type box 321 and temperature box 322. Design name box 311 includes a user defined name for a present chip IO design. Design path box 312 includes a directory path for IOSim 100 input and output files. Floor file box 313 includes a user defined file name for a floor file. IO buffers path 314 includes a directory path to IO buffer circuit description files stored in library of electrical circuit descriptions folder 142. Interconnect & models path box 315 includes a directory path to a folder comprising silicon technology information folder 143 and package technology information folder 144. Model type box 321 includes selected model type. Temperature box 322 includes circuit temperature for simulation.

A floor file referenced in floor file box 312 of FIG. 3 is constructed by a user and stored in block description of chip interface folder 141. A floor file includes a high level description of IO buffer circuit placement on a chip. FIG. 4 is an example of a floor file called pc3*bo*1c.*flr* setting forth an input/output buffer floor plan for a chip. A floor file comprises pin numbers in the left hand column and correspondingly IO buffer circuit description file names in the right hand column. In one embodiment of the present invention, pin numbers in the left hand column are automatically inserted. Floor file pc3*bo*1c comprises a power pin (pv3*e*), a ground pin (pv0*e*) and an IO buffer circuit pt6*o*05*c*. An IO buffer circuit description file comprises references to electrical elements of an IO buffer circuit that is included in a chip's IO buffer ring. Therefore, an IO buffer circuit description file describes the circuitry located within the designated IO buffer. One embodiment the present invention is capable of reading and automatically extracting information from computer aided design (CAD) tool files (e.g., Apollo place and route input files).

Figure 5:
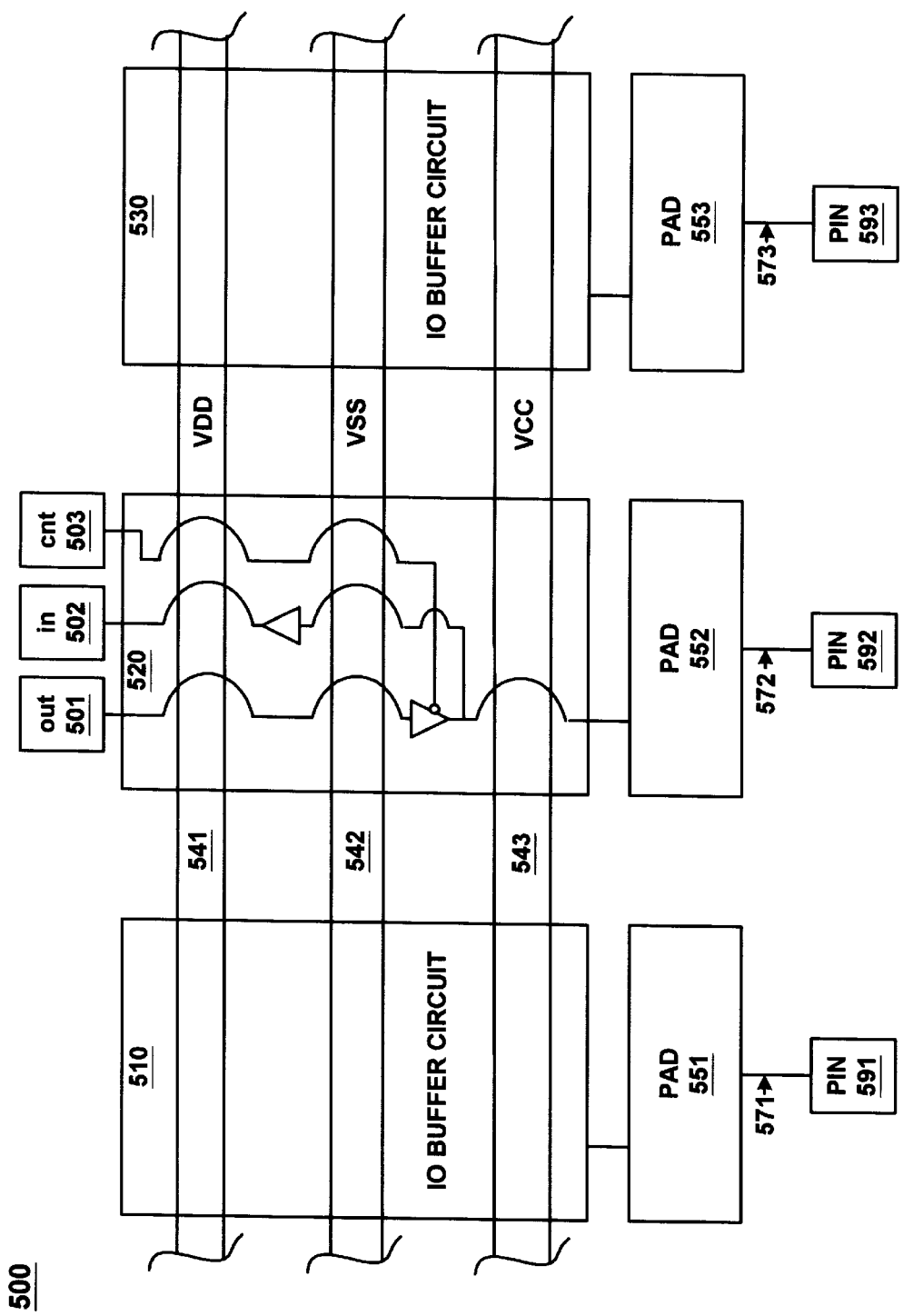
FIG. 5 is a schematic illustrating the placement of IO buffer circuits in a typical IO buffer ring in accordance with the present invention.

FIG. 5 is an electrical schematic illustrating the placement of IO buffer circuits in a typical IO buffer ring 500. IO buffer ring 500 comprises IO buffer circuit 510, IO buffer circuit 520, IO buffer circuit 530, VDD power bus 541, VSS power bus 542, VCC power bus 543, VCCE power bus (not shown), VSSE power bus (not shown), pad 551, pad 552, pad 553, lead 571, lead 572 lead 573, pin 591, pin 592, and pin 593. VDD power bus 541, VSS power bus 542 and VCC power bus 543 are each coupled to IO buffer circuit 510, 520, and 530. IO buffer circuit 510 is coupled to pad 551, which is coupled to pin 591 via lead 571. Pin 592 is coupled via lead 572 to pad 552, which is coupled to IO buffer circuit 520. IO buffer circuit 530 is coupled to pad 553 which is coupled to pin 593 via lead 573. IO buffer circuit 520 is coupled to out port 501, in port 502 and control port 503 which are coupled to the chip core (not shown). IO buffer circuit 501 and IO buffer circuit 530 are similarly coupled to in ports (not shown), out ports (not shown) and control ports (not shown).

In one embodiment of the present invention IO buffer circuit description files include files compliant to a well known SPICE format. FIG. 6 is an example of an IO buffer circuit description file called pt6o05c, which in this particular embodiment describes an output only buffer circuit. In order not to obscure aspects of the invention with well known and exhaustive numbers of SPICE file descriptions of IO buffers, IO buffer circuit description file pt6o05 is presented in a brief generic format. Description file pt6o05c is SPICE complaint and comprises a file call (e.g. pt6o05c), external nodes to which the IO buffer is coupled (e.g. In, Pad, VCC, etc.), identification of internal devices (e.g., transistor M1, capacitor C2, resistor R4, etc.) nodes to which internal devices are coupled (e.g., ND, NG, N1, N2, etc.), and values for internal devices such as ohms, henrys, microns, etc.

In response to a user clicking the OK button 223 (see FIG. 2), user interface module 110 (see FIG. 1A) issues a command to electrical component model generator 120 and to electrical characteristic model generator 130 to process the information entered in the data entry boxes of design setup subwindow 300 (see FIG. 3). Electrical component model generator 120 and electrical characteristic model generator 130 retrieve the appropriate files from library of electrical circuit descriptions folder 142, silicon technology information folder 143, package technology information folder 144 and library of circuit electrical characteristics folder 145. Electrical component model generator 120 and electrical characteristic model generator 130 process the information provided by a user and retrieved from other sources to construct a description file of a circuit being analyzed that is more detailed than a bare floor plan. For example, electrical component model generator 120 retrieves and reads a floor file specified in a GUI, then retrieves IO buffer circuit description files referenced in the floor file and searches the retrieved description files for power lines utilized in a design being analyzed. Electrical component model generator 120 then instructs user interface module 110 of the power lines included in the design and user interface module 110 prompts a GUI to display a listing of the power lines.

Figure 7:
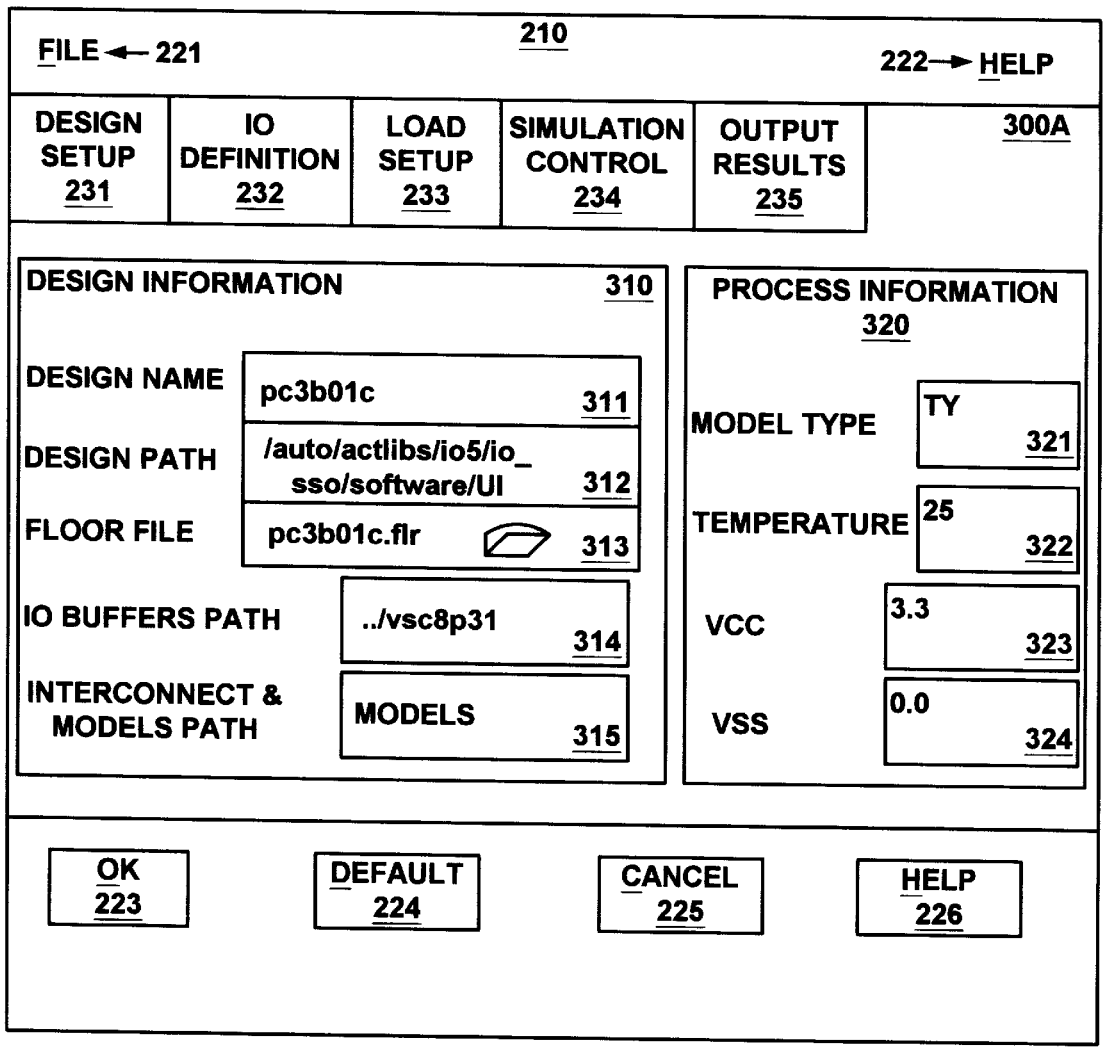
FIG. 7 is an illustration of a design setup subwindow of the present invention with a display listing power lines coupled to IO buffer circuits.

FIG. 7 is an illustration of design setup subwindow 300A with a display listing power lines coupled to IO buffer circuits. Design setup subwindow 300A is the same as design window 300 except it includes a data entry box for each power line coupled to an IO buffer circuit, such as VCC box 323 and VSS box 324. Electrical component model generator 120 supplies a default value that appears in VCC box 323 and VSS box 324. A user may alter the values in VCC box 323 and VSS box 324 through standard processes such as typing over the present value. A voltage source value is established for each power line, and IO buffers coupled to a power line are assigned the defined voltage source value for that power line.

IO definition tab 232 calls up IO definition subwindow 800 shown in FIG. 8. IO definition subwindow 800 of FIG. 8 provides a graphical display of the power line connections to IO buffer circuits in a chip and electrical information regarding data lines coupled to an IO buffer circuit. IO definition subwindow 800 comprises IO buffer information section 810, power line section 820, and data line section 830. IO buffer information section 810 comprises circuit description file name label 811, slot name box 812, and pin identification (ID) box 813. Power line section 820 comprises a left side connection indicator (e.g., box 21), power line identification label (e.g., VCC label 822), and right side connection indicator (e.g., box 823). Data line section 830 comprises name column 831, signal column 832, and capacitance column 833. Name column 831 comprises names identifying a signal. Signal column 832 comprises entry boxes including definitions of the corresponding signal identified in name column 831. Capacitance column 833 comprises data entry boxes including capacitance of the signal identified in name column 831.

In FIG. 8, slot name box 812 and pin identification (ID) box 813 indicate that IO definitions for slot 1 and pin 1 are being displayed. The values entered in circuit description file name label 811, left side connection indicator (e.g., box 21), power line identification label (e.g., VCC label 822), right side connection indicator (e.g., box 823), name column 831, signal column 832 and capacitance column 833 are automatically entered by IOSim 100. In one embodiment of the present invention, electrical component model generator 120 manipulates data from the files it previously retrieved to determine appropriate default values or settings to enter in IO definition subwindow 800 depending on the information a user enters in slot name box 812 and pin identification (ID) box 813.

Figure 9:
FIG. 9 is an illustration depicting IO definition subwindow in accordance with the present invention associated with IO buffer circuit assigned to slot 47 of a chip.

IO definition subwindow 800 of FIG. 8 provides a convenient interface for modifying the default values or settings, such as interconnections to IO buffer circuits in a chip and electrical information regarding data lines coupled to an IO buffer circuit. For example, FIG. 8 shows power interconnections disabled on the left side of an IO buffer circuit associated with slot 1, and FIG. 9 shows power interconnections disabled on the right side of an IO buffer circuit associated with slot 47. Note that FIG. 9 shows that the PIN data line referenced in name column 831 has VSS specified in signal column 832 associated with slot 47 instead of VCC as in FIG. 8 (illustrating data line electrical values associated with slot 1).

FIG. 10 is an illustration of IO definition subwindow 800 with slot 4 selected. In FIG. 10 all power lines are selected and data lines comprise CIN and PIN. In FIG. 11 a user has deselected some lines by clicking on right connection indicators such as right connection indicator 828 associated with VCCA. The user has also modified the definition of signal names in signal column 832 and capacitance values in capacitance column 833.

Figure 12:
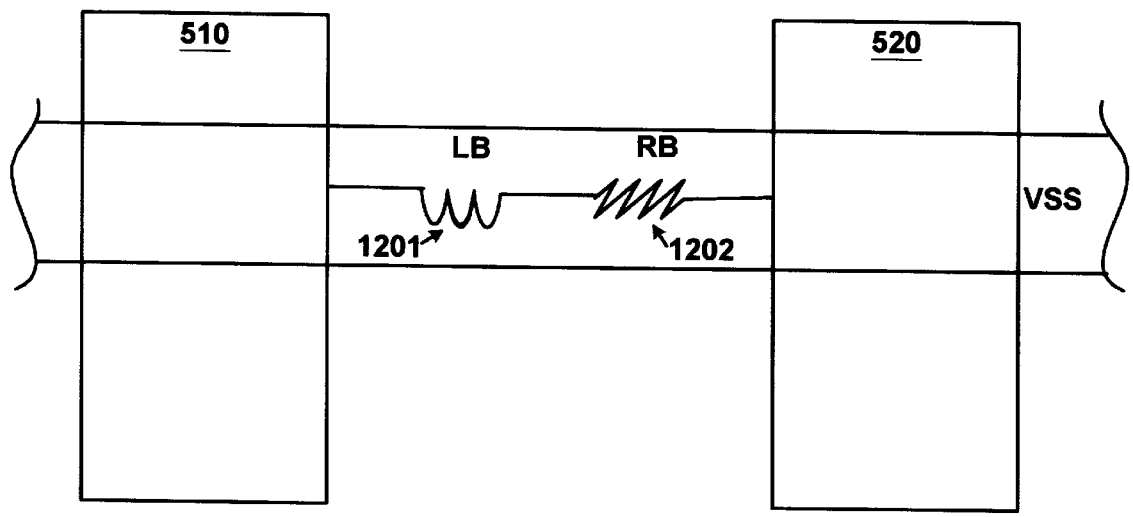
FIG. 12 is a symbolic illustration of internal electrical characteristics of buses coupled to IO buffer circuits.

In addition to the internal electrical characterization of an IO buffer provided by an IO buffer circuit description file, there are external characteristics that affect the operation of an IO buffer circuit. In particular, external elements coupled to an IO buffer circuit have physical properties and intrinsic electrical characteristics that usually impact signal processing. For example, most conductive materials actually resist current flow (even if it is only a relatively slight resistance) and generate self induced electro-magnetic fields. Typically internal power buses such as VDD power bus 541, VSS power bus 542, VCC power bus 543, VCCE power bus (not shown), and VSSE power bus (not shown) have internal resistive and inductive characteristics that affect signal transmission through an IO buffer circuit. FIG. 12 is a symbolic illustration of bus internal resistance (RB) 1202 and bus internal inductance (LB) 1201 of VSS power bus 542 between IO buffer circuit 510 and IO buffer circuit 520. Note, the resistor and inductor schematic images are symbols representing the intrinsic resistance and inductance in VSS power bus 542. Bus internal resistance (RB) 1202 and bus internal inductance (LB) 1201 are not separate resistor and inductor devices.

Figure 13:
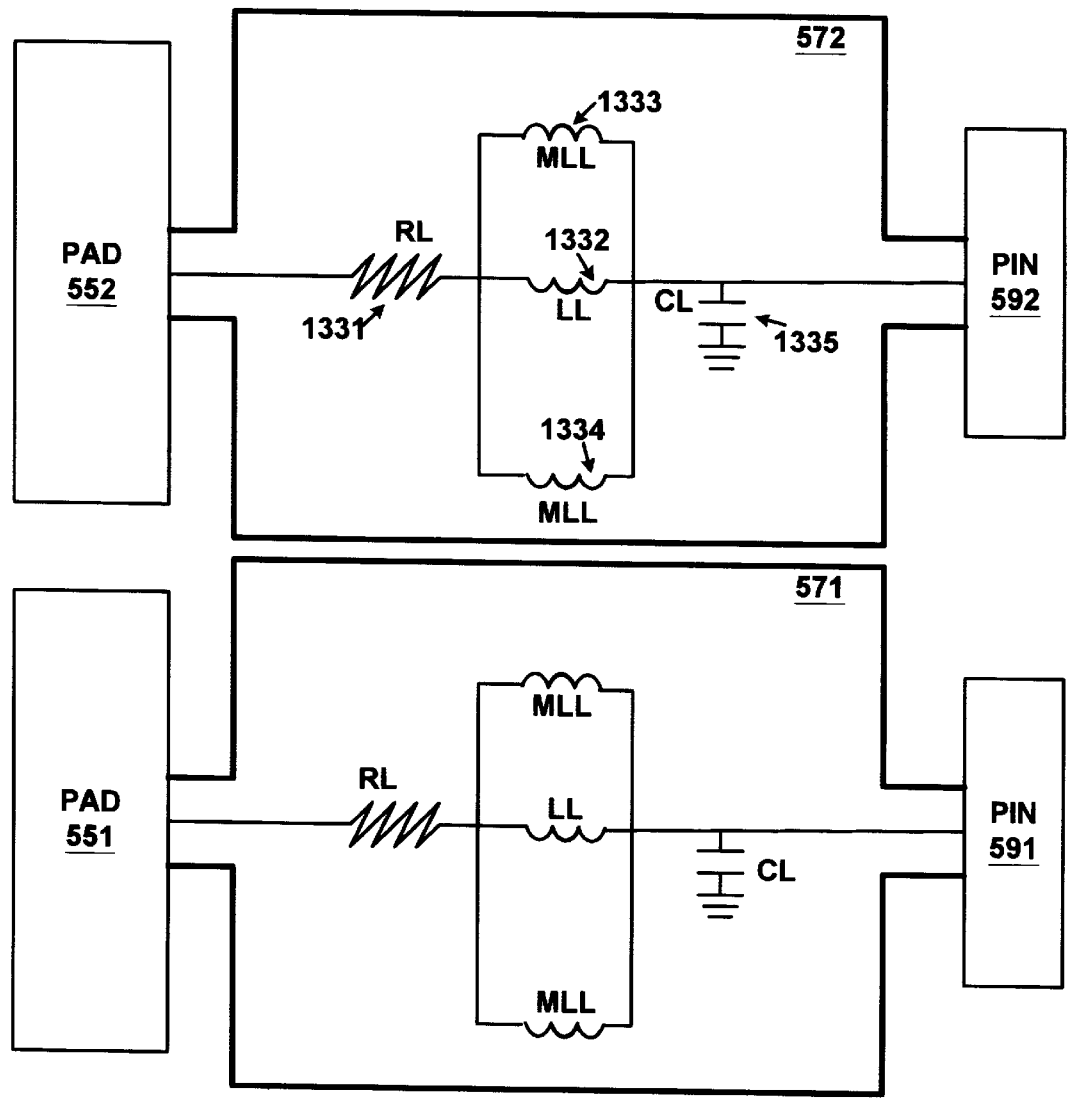
FIG. 13 is a symbolic illustration of electrical characteristics associated with a lead coupled between a pad and a pin.

Other external electrical characteristics that affect an IO buffer circuit include electrical characteristics exhibited by a lead between a pad and a pin. FIG. 13 is a symbolic illustration of electrical characteristics associated with lead 572. The electrical characteristics associated with lead 572 comprise lead resistance (LR) 1331, lead inductance (LI) 1332, a first lead mutual inductance 1333, a second lead mutual inductance 1334, and a lead capacitance (LC) 1335. First lead mutual inductance 1333 and second lead mutual inductance 1334 are caused by neighboring leads 571 and 573 respectively. There are a number of factors that affect the values of the electrical characteristics of a lead. For example, internal inductance is different form wiring package to wiring package and from pin to pin. Internal inductance also depends upon where the IO is located on the chip (e.g. the corner, middle, etc.).

Other embodiments of IOSim 100 are able to calculate values for electrical characteristics that affect the performance of an IO buffer circuit, permitting IOSim 100 to be more versatile and not as dependent of other sources such as memory files. For example, one embodiment of IOSim 100 is able to calculate inductance and resistance related entries in appropriate subwindows from more abstract information. For every unit measurement of distance (e.g., meter) in a conductor between components a calculation will be performed to determine the total internal resistance and internal inductance of the conductor and resulting values will automatically be inserted in the appropriate data entry boxes. In one embodiment of the present invention, distances between components are automatically calculated based upon physical position information extracted from CAD tool set up files (e.g., Apollo TDF files).

Clicking on load setup tab 233 (see FIG. 2) calls up load setup sub window 1400, shown in FIG. 14. Load setup subwindow 1400 comprises interconnect load section 1410 and pin package load section 1420. Interconnect load section 1410 comprises identification column 141 1, inductance column 1412, and resistance column 1413. Identification column 1411 identifies an internal bus in a chip such as a power or ground bus (e.g., VSS). Inductance column 1412 includes an intrinsic inductance value of a corresponding bus section between two IO buffer circuits (e.g., LB 1201). Resistance column 1413 includes a resistance of a corresponding bus section between two IO buffer circuits (e.g., RB 1202). Pin package load section 1420 comprises data boxes including inductance box 1421, resistance box 1422 and capacitance box 1423. Inductance box 1421 includes a value for lead inductance 1332 (e.g., LI 1332), resistance box 1422 includes a value for lead resistance (LR 1331), and capacitance box 1423 includes a value for a lead capacitance (e.g., LC 1335).

Initial default values in identification column 1411, inductance column 1412, resistance column 1413, inductance box 1421, resistance box 1422 and capacitance box 1423 are automatically provided by electrical component model generator 120 depending on information provided by a user and package technology files selected from package technology information folder 144. In one embodiment of the present invention, electric model generator 120 manipulates data from the files it previously retrieved to determine appropriate default values or settings to enter in load setup subwindow 1400. The default values or settings entered in load setup subwindow 1400 are modified if a user types in a different value.

Figure 15:
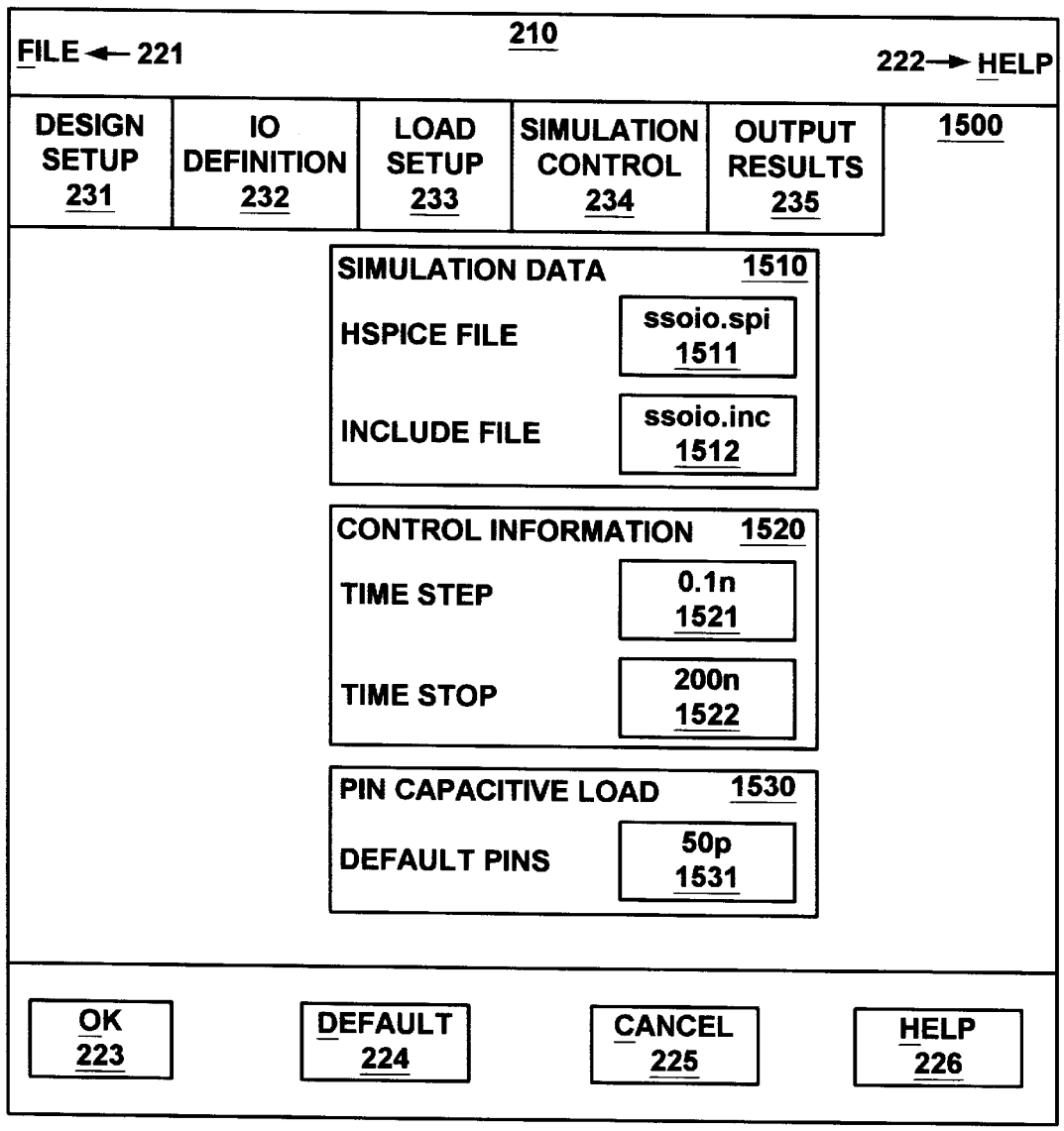
FIG. 15 is an example of one embodiment of simulation control subwindow in accordance with the present invention showing values assigned to control information and pin capacitive load.

FIG. 15 is an example of one embodiment of simulation control subwindow 1500. Simulation control subwindow 1500 is activated by clicking on simulation control tab 234. Simulation control subwindow 1500 comprises simulation section 1510, control information section 1520, and pin capacitive load section 1530. Simulation data section 1510 comprises SPICE file box 1511 and include file box 1512. SPICE file box 1511 comprises a name of a SPICE output file. The include file box 1512 comprises the name of a user file that has additional control defined by a user and is included in the SPICE files above. Control information section 1520 comprises time step box 1521 and time stop box 1522. Time step box 1521 comprises transient analysis time step and time stop box 1522 comprises transient analysis time stop. Pin capacitive load section 1530 comprising default pins box 1531. Default pins box 1531 comprises the capacitance value used for data lines if not defined by a user. The pin capacitance value entered in default pins box 1531 models a load on the pins in a chip. If the value appearing in default pins box 1531 is "NIL", no capacitance will be connected for lines that have no user defined capacitance.

Figure 16:
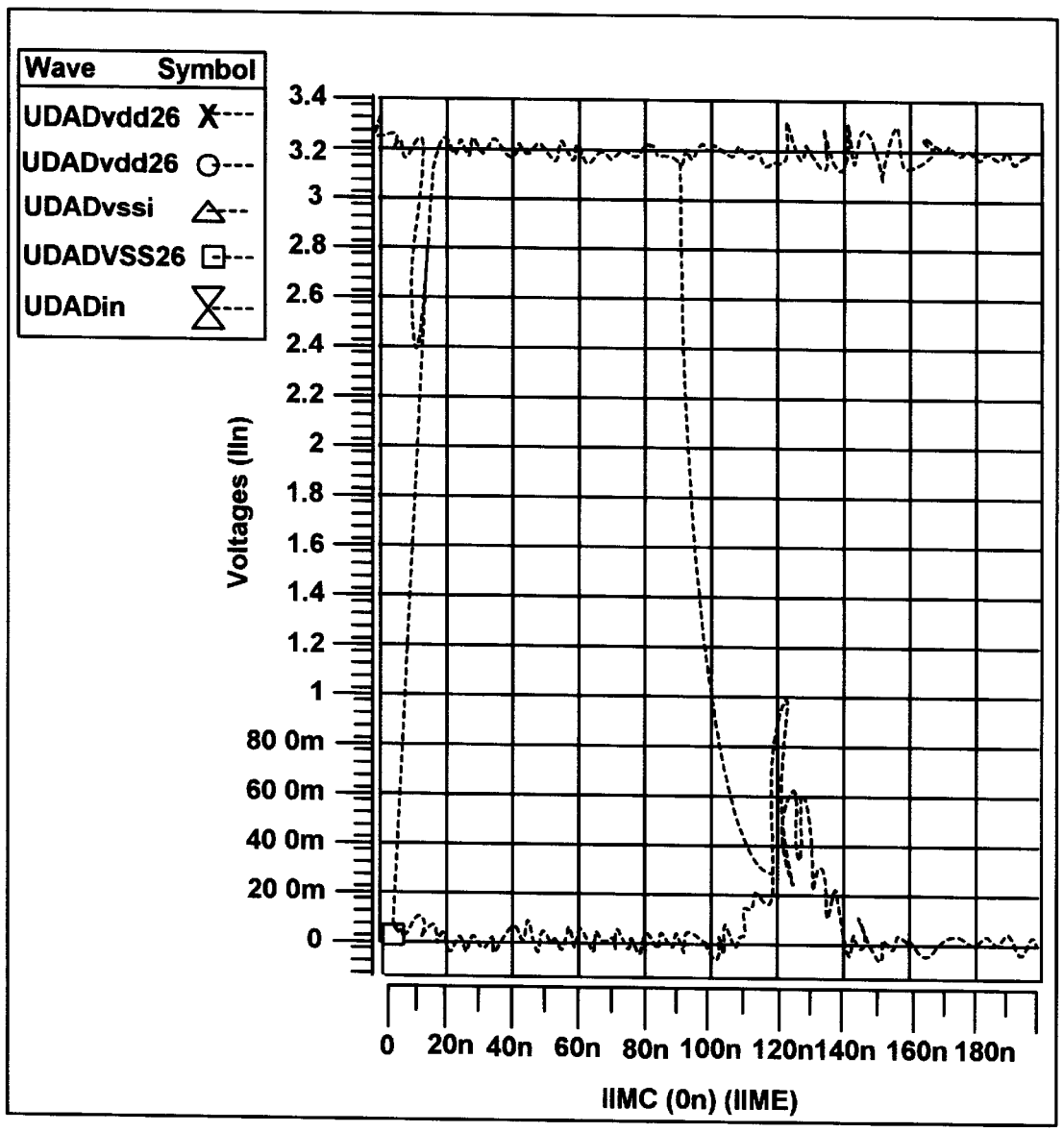
FIG. 16 is a graph illustrating noise in a VSS and VDD power line of one IO buffer configuration analyzed using IOSim in accordance with the present invention.

Output results tab 235 activates a subwindow displaying output results of the configuration under test. After manipulating the design using IOSim 100 a user's configuration is saved in a file (e.g., pc3$b$01c.rc). A final SPICE file based on a user's configuration file is generated and includes a file that has user control commands (e.g., pc3$b$01c.ctl) and saves it in electrical component description folder 151. Output simulation results are saved in a file (e.g., pc3$b$01c.tr0). FIG. 16 is a graph illustrating noise in a VSS and VDD power line of one IO buffer circuit analyzed using IOSim 100. IOSim 100 enables SPICE to have additional features such as viewable waveforms after a simulation, easier specification of input signals activities and ability to read test vectors previously defined. IOSim can convert vectors in one language into formats usable by SPICE.

Figure 17:
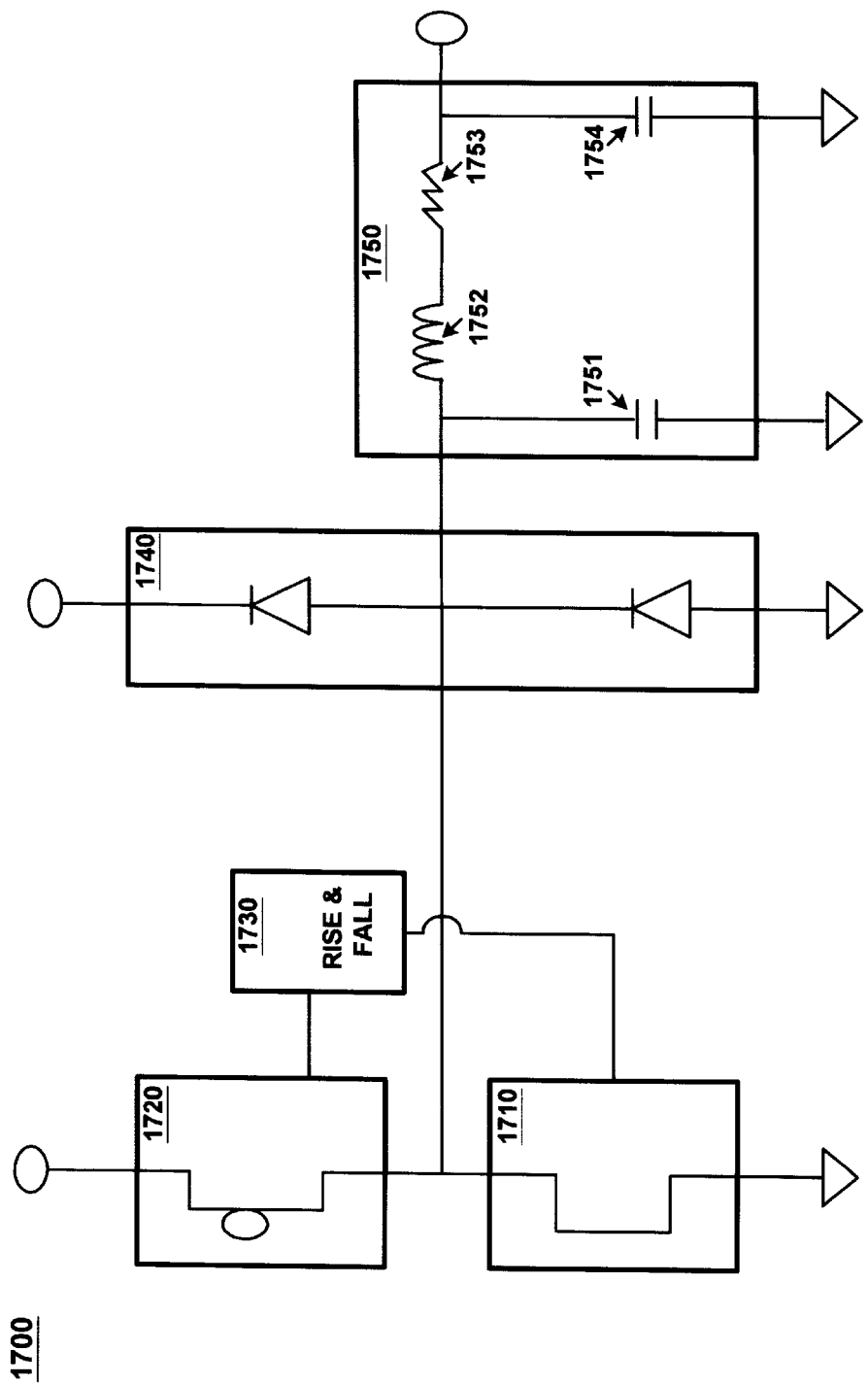
FIG. 17 illustrates a symbolic representation of elements included in an IBIS model of an electrical IO buffer circuit, a pad and a pin.

FIG. 17 illustrates a symbolic representation of elements included in an IBIS model 1700 of an electrical IO buffer circuit, a pad, and a pin. The elements of IBIS model 1700 are not necessarily actual individual components, the elements are models of electrical characteristics of an IO buffer circuit and its associated pad, lead, and pin. Theses models of electrical characteristics are included in files in library of circuit electrical characteristics folder 145 (see FIG. 2). The elements of IBIS model 1700 comprise pulldown transistor 1710, pull-up transistor 1720, transition time characteristics 1730, DC I/V characteristics of clamping diodes 1740, and parasitic characteristics 1750. Parasitic characteristics 1750 comprises output pad capacitance 1751, lead inductance 1752, lead resistance 1753, and lead capacitance 1754. Pull-up transistor 1710 and pulldown resistor 1720 are analytically coupled to each other, transition time characteristics 1730 and DC I/V characteristics of clamping diodes 1740. DC I/V characteristics of clamping diodes 1740 are analytically coupled to parasitic characteristics 1750. Pad capacitor 1751 is the total output capacitance due to an output pad, clamp diodes and input transistors. Lead inductance 1752, lead resistance 1753 and lead capacitance 1754 are the inductance, resistance and capacitance of the lead bond wire and pin combination, similar to lead internal resistance (RL) 1331, lead internal inductance 1332, and lead capacitance 1335.

FIG. 18 illustrates an example of a partial listing of an IBIS model file 1800 included in library of circuit electrical characteristics folder 145 shown in FIG. 2. IBIS model file 1800 comprises general header section 1801, pulldown element section 1802, pull-up element section 1803, characteristics of clamping diodes section 1804, parasitic characteristics section 1805 and transition time characteristics section 1806.

General header section 1801 comprises a model name 1801, model type 1802, polarity data 1803, enable data 1804, total output capacitance due to an output pad (c-comp) 1805, temperature range data 1815 and voltage range data 1816. Model name 1801 references a file name for the particular IO buffer ring being designed or analyzed. Total output capacitance (c-comp) 1805 is a total output capacitance due to a pad.

Pulldown element section 1802 of FIG. 18 is associated with pulldown transistor 1710 element and includes pulldown information that provides a model (table) of IO buffer circuit characteristics when driven low. The pull-down information is presented in four columns comprising voltage column 1820, I (typ) column 1830, I (min) column 1840 and I (max) column 1850. I (typ) column 1803 comprises typical current measurements, I (min) column 1840 comprises minimum current measurements and I (max) 1850 comprises maximum current measurements.

Pull-up element section 1803 corresponds to pullup transistor 1720 element and includes pullup information that provides a model of IO buffer circuit characteristics when driven high. Note, the voltages in the pullup table are VCC relative and are derived from the equation Vtable=VCC−Voutput. The pullup information is presented in four columns similar to voltage column 1820, I (typ) column 1830, I (min) column 1840, and I (max) column 1850.

Characteristics of clamping diodes section 1804 corresponds to DC I/V characteristics of clamping diodes 1740 and includes ground-clamp information and diode data (when present). Driver information associated with pull-down transistor 1710 element and pull-up transistor 1720 element are modeled in parallel with clamp diode characteristics, ensuring diode characteristics are present even when the output buffer is in a high-impedance state (off). Again the clamping diode characteristics are presented in four columns similar to voltage column 1820, I (typ) column 1830, I (min) column 1840, and I (max) column 1850.

Transition time characteristics section 1805 of FIG. 18 corresponds to transition time characteristics 1730 element including ramp time associated with pullup and pulldown transistors. Transition time characteristics section 1805 comprises a number of columns including a ramp variable column 1871, a ramp typical time column ("typ") 1872, a ramp minimum time column ("min") 1873, a ramp maximum time column ("max") 1874, a rising waveform data column 1881, a rising waveform specific time column ("time") 1882, a rising waveform voltage typical column ("V(typ)") 1883, a rising waveform voltage minimum column ("V(typ)") 1884, a rising waveform voltage maximum column ("V(typ)") 1885, a falling waveform data column 1891, a falling waveform specific time column ("time") 1892, a falling waveform voltage typical column ("V(typ)") 1893, a falling waveform voltage minimum column ("V (typ)") 1894, and a falling waveform voltage maximum column ("V(typ)") 1895. Rising and falling "time" columns 18832 and 1892 represent specific times. Rising and falling "typ" columns 1883 and 1893 represent typical rise/fall voltage at a corresponding specific time. Rising and falling "min" columns 1884 and 1894 represent minimum rise and fall voltages at a specific time and similarly rising and falling "max" columns represents maximum voltages. These values often appear very small because they are intrinsic values for a transistor with all packaging and external loads removed.

In another embodiment of the present invention, packaging characteristics are included in a separate element section. The separate element section comprises data on inherent electrical characteristics associated with portions representing lead characteristics and package trace. The package characteristics are modeled by elements such as lead inductance 1752, lead resistance 1753, and lead capacitance 1754 schematically organized as shown in FIG. 17. The packaging characteristics separate element section comprises a table similar to those described above indicating a range (minimum to maximum). In one embodiment of the present invention, the packaging characteristics separate element section is described in a more complex manner, including mutual inductance and impedance values.

In one embodiment of the present invention, elements (or electrical characteristics) included in IBIS model 1700 are obtained by direct measurements. In another embodiment, elements included in IBIS model 1700 are derived under defined test conditions from SPICE model simulation inputs. SPICE models often include process variations that are translated into IBIS format input minimums and maximums, permitting IBIS simulations to reflect operations under extreme temperature and power supply conditions. Close approximation of a voltage variation adjustment is accomplished by shifting I/V data in accordance with a desired voltage tolerance.

Once a user has entered appropriate information and clicks OK button 223 (see FIG. 2), electrical component model generator 120 automatically generates an electrical component description simulation tool input file, and electrical characteristic model generator 130 creates an electrical characteristic description simulation tool input file. The simulation tool input files are based on information provided by a user via a GUI coupled to user interface module 110 and additional information necessary to generate description simulation tool input files. The additional information is automatically assembled by electric model generator 120 and electrical characteristic model generator 130. The simulation tool input files created by IOSim 100 are usually extensively detailed text file descriptions of a circuit being designed or analyzed such as an IO buffer ring on a microelectronics chip.

FIG. 19 comprises a partial listing of a SPICE simulation tool input file, SPICE file 1900. Typically a SPICE simulation tool input file is made up of several sections. For example, SPICE file 1900 comprises IO buffer netlist 1910, power interconnect output section 1920, package pin load section 1930, pin capacitance section 1940 and internal waveform section 1950.

IO buffer netlist 1910 comprises SPICE subcircuit calls for each slot on a chip being designed or analyzed. Each slot subcircuit call includes a reference to an IO buffer circuit in the last notation in the call (e.g., pv2$i$, pt6$o$05$c$, etc.) and nodes coupled to the IO buffer circuit.

Power interconnect output section 1920 comprises information on the electrical characteristics of external connections that couple one slot to another slot. For example interconnect slot 2 cell PT6$o$05$c$ comprises subcircuit call XVCC23 that defines electric characteristics of a bus (line) segment between nodes VCC2 coupled to IO buffer circuit assigned to slot 2 and node VCC3 coupled to IO buffer circuit assigned to slot 3 as set forth subcircuit mvcc and sets the bus internal inductance (LB) at 0.07 NH and bus internal resistance (RB) at 0.211 ohms.

Package pin load section 1930 includes subcircuit calls that define electrical characteristics of a lead between a pad and a pin. For example, Xpad2 subcircuit call indicates the electrical characteristics between pad2 and pin2 are defined by subcircuit mpin and the lead inductance is equal to 5 nanohenries, the lead resistance is equal to 0.2 ohms and the lead capacitance is 0.5 picofarrads. Pin capacitance section 1940 comprises capacitive characteristics or a load coupled to an IO buffer circuit.

Internal waveform section 1950 of FIG. 19 comprises a very important file ssoio.inc that defines internal waveforms. Waveforms defined in ssoio.inc comprise signals fed into an IO buffer circuit. The definition indicates when an IO buffer should switch, ensuring a static signal stays static during a switch by including another input (e.g., iS). File ssoio.inc also includes voltage supply levels over time and has lines that point a SPICE tool to access subcircuits in a particular directory. In one embodiment the present invention includes a simple interface (not shown) to define signal sources and wire connections. For example, a default set-up file (e.g., iosimrc) is provided in one embodiment.

Figure 20:
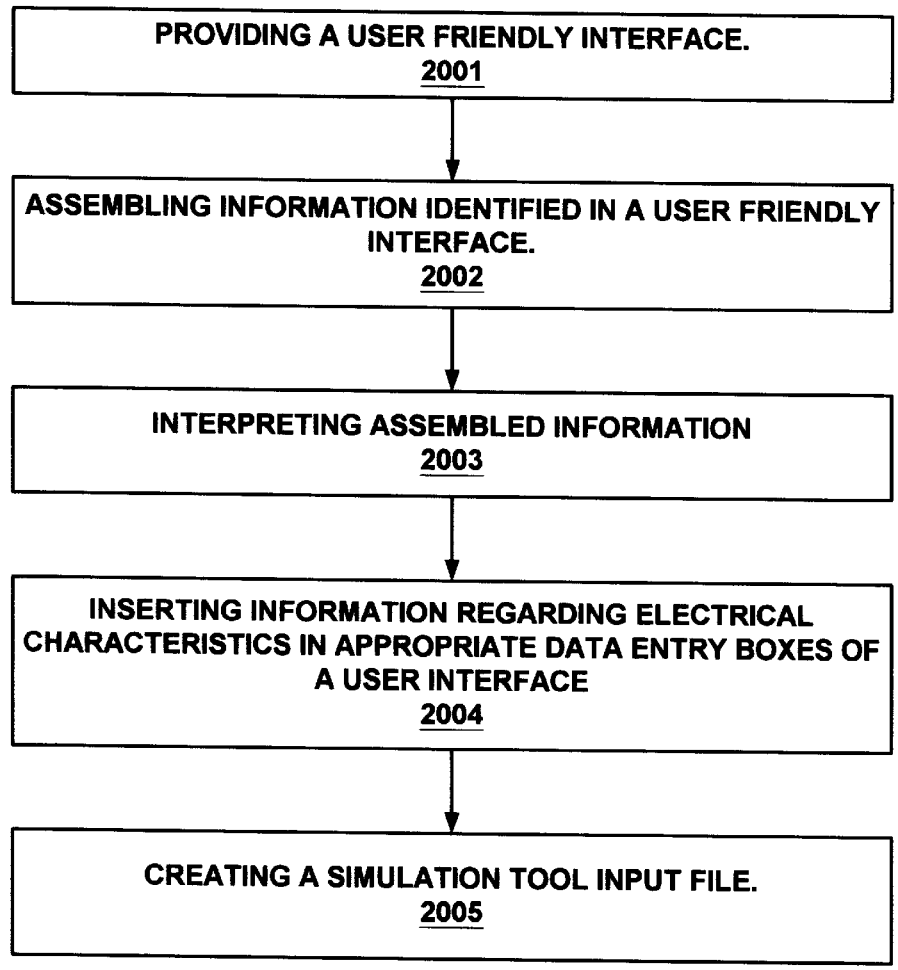
FIG. 20 is a flow chart of one embodiment of an IOSim method in accordance with the present invention.

FIG. 20 is a flow chart of a process 2000 performed by one embodiment of the present invention, IOSim 100. Process 2000 is implemented in a computer system of FIG. 1B. Process 2000 enables a user to conveniently and efficiently create simulation tool input files. A user is relieved of many mundane, convoluted and error prone manual data entry tasks by process 2000 in the creation of simulation tool input files. Process 2000 also permits a user to easily modify simulation tool input files for convenient analysis of circuits by simulation tools. In one embodiment of process 2000 a user utilizes point and click features of a user interface included in IOSim 100 to indicate whether a bus is coupled to an IO buffer circuits and process 2000 automatically modifies corresponding text in a simulation tool input files.

In step 2001 IOSim 100 provides a user friendly interface that enables a user to conveniently and efficiently enter information. For example, presenting information in a GUI with point and click features. In another embodiment the user friendly interface capable of communicating in a batch mode text format.

In step 2002 IOSim 100 assembles information identified in a user friendly interface. IOSim 100 retrieves files identified in said user friendly interface and searches their contents to analyze what information is included and what additional information is required to create a simulation tool input file. Then missing information required to create a simulation tool input file is gathered by performing iterative exchanges of information between an IOSim, a user and other sources such as library folders. When the requisite information is gathered, electrical characteristic values are inserted in appropriate data entry boxes.

Step 2003 comprises interpretation of information provided in the iterative exchanges in step 2002. Step 2003 comprises searching for information in files identified in the user friendly interface and processing retrieved information to determine if any additional data is required to create a simulation tool input file. IOSim also deciphers user initiated information modifications provided via said a user friendly interface.

In step, 2004 IOSim 100 inserts information regarding electrical characteristic values in appropriate data entry boxes of a user interface. User initiated information modifications and information retrieved from other sources are processed. Corresponding entries in a simulation tool input file are adjusted to reflect said user initiated information modifications.

Step 2005 includes the creation of a simulation tool input file. Simulation tool input files are constructed based upon the interpretation of information provided in iterative exchanges described in step 2003 and retrieved from said other sources. IOSim 100 generates an electrical simulation tool input file and produces an electrical characteristic simulation tool input file. The electrical simulation tool input files are compatible with a SPICE simulation tool input file format and a electrical characteristic simulation tool input file is compatible with an IBIS simulation tool input file format.

The present invention relieves a user of tedious tasks associated with creating simulation tool input files. For example, utilizing user friendly GUIs of IOSim 100 a user enters a few library folder names and a relatively simple floor plan file. IOSim 100 retrieves appropriate data and populates entries in subwindows of IOSim 100. Users can conveniently modify the entries in subwindows they wish. After any modifications to subwindow entries, IOSim 100 automatically creates extensive simulation tool input files such as a SPICE input file and an IBIS simulation file. The electrical component description simulation and the electrical characteristic simulation can be created simultaneously by providing the input files to both electric simulation and electrical characteristic simulation tools at the same time If users wish to later change a design configuration they can direct IOSim 100 to make the changes via the user friendly GUI. IOSim will automatically assemble a new simulation tool input file with appropriate modifications. For example, IOSim makes it relatively easy to analyze the impact of cutting a particular bus (e.g., VSS) in between two IO buffer circuits. A user would simply indicate a bus disconnection by clicking on an appropriate right connection indicator or left connection indicator (similar to the example illustrated in FIG. 11). IOSim would automatically formulate the appropriate changes to a simulation tool input file to indicate that an IO buffer circuit was no longer connected to a corresponding bus node and it would also automatically adjust bus internal resistance and bus internal inductance to account for the cut. IOSim is so convenient to use that in addition to IOSim 100 making it relatively easy for a user to determine the affects of cutting a particular bus in a particular location, a user can easily determine the consequences of cutting a location on a wrong bus or making a cut in the wrong location on the correct bus by simply disconnecting the corresponding left connection indicator and/or right connection indicator. The present invention facilitates easy rearrangement of a floorplan, including adding, subtracting or repositioning power and ground pads and change IO buffers to compare performance levels.

Thus, the system and method of the present invention permits a designer to efficiently and effectively create and modify electrical circuit simulation tool input files. The system and method enables a user to conveniently (enter convey communicate) information sufficient to adequately describe features of the circuit being designed or analyzed while minimizing the amount of data a user has to manually enter. The system and method allow a user to easily modify design features without manually modifying the entire simulation input file. The system and method of the present invention provide simulation input files including electrical component description simulation tool input files and electrical component description simulation input files such as SPICE formatted input files and IBIS formatted input files. These simulation input files permit detailed signal integrity analysis and characterization of internal and external signals in one simulation session. For example, the system and method economically generate simulation input files of a chip's interface circuitry in a manner that allows the use of simulation tools to design and analyze an IO buffer circuit ring integrated on an electronic chip.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. In a computer system, a simulation tool input file generator, comprising:
    a user interface for selecting circuit description files that describe electrical characteristics of interface circuitry in an integrated circuit chip and for entering programmable values associated with said electrical characteristics in said circuit description files, said interface circuitry comprising an input/output buffer circuit and a pad;
    a simulation tool input file associated with said interface circuitry, said simulation tool input file comprising a description of said electrical characteristics and said programmable values of said input/output buffer circuit, and said pad, said electrical characteristics and said programmable values compatible with a simulation tool input protocol; and
    a simulation model generator for automatically generating said simulation tool input file corresponding to said interface circuitry on said integrated circuit chip, said simulation model generator generating said simulation tool input file by: first converting said electrical characteristics and programmable values into a file format that is compatible with said simulation tool input file protocol; and second automatically inserting resistances, inductances, capacitances and electrical characteristics required to complete a formulation of said simulation tool input file description of said interface circuitry, wherein said model generator automatically indicates in said simulation tool input file a bus connection between a plurality of said input/output buffer circuits.

2. The simulation tool input file generator of claim 1 wherein said simulation model generator automatically inserts in said simulation tool input file programmable values of resistance and inductance associated with said bus connection between a plurality of said input/output buffer circuits.

3. The simulation tool input file generator of claim 1 wherein said simulation tool input file is in an electrical component description format.

4. The simulation tool input file generator of claim 1 wherein said simulation tool input file is in an simulation program with integrated circuit emphasis (SPICE) description format.

5. The simulation tool input file generator of claim 1 wherein said electrical simulation tool input file is in a electrical characteristic description format.

6. The simulation tool input file generator of claim 1 wherein said electrical simulation tool input file is in an input/output buffer information specification (IBIS) description format.

7. In a computer system, an interface circuitry simulation tool input file generator for an integrated circuit chip, comprising:
    an input/output (IO) buffer circuit description file comprising a field assigned to a programmable value associated with interface circuitry of an integrated circuit chip;
    a user interface for selecting said IO buffer circuit description file and entering a value corresponding to an electrical characteristic of said integrated circuit chip interface circuitry in said field, said user interface coupled to said IO buffer circuit description file; and
    a simulation model generator for automatically creating a simulation tool input file corresponding to said IO buffer circuit description file, said simulation tool input file comprising electrical characteristics of an IO buffer, a pad and a pin and information on electrical characteristics of both external connections that couple one IO buffer circuit to another IO buffer circuit and a lead between a pad and a pin coupled to said IO buffer circuit, wherein said simulation tool input file generator automatically indicates whether said bus is coupled to said IO buffer circuit and incorporates said buses coupled to said IO buffer circuit in said simulation tool input files.

8. The interface circuitry simulation tool input file generator of claim 7 wherein said simulation model generator automatically inserts in said field a programmable value corresponding to an inductance of a bus coupled to said IO buffer circuits and incorporates said inductance in said simulation tool input files.

9. The interface circuitry simulation tool input file generator of claim 7 wherein said simulation model generator automatically inserts in said field a programmable value corresponding to a resistance of a bus coupled to said IO buffer circuits and incorporates said resistance elements in said simulation tool input files.

10. The interface circuitry simulation tool input file generator of claim 7 wherein said simulation tool input file generator automatically indicates the values of a lead inductance, lead resistance and lead capacitance in an entry box of said user interface and incorporates said values of said lead inductance, lead resistance and lead capacitance in said simulation tool input files.

11. The interface circuitry simulation tool input file generator of claim 7 wherein said simulation tool input file is in a simulation program with integrated circuit emphasis (SPICE) description format.

12. The interface circuitry simulation tool input file generator of claim 7 wherein said electrical simulation tool input file is in an electrical characteristic description format.

13. The interface circuitry simulation tool input file generator of claim 7 wherein said electrical simulation tool input file is in an input/output buffer information specification (IBIS) description format.

* * * * *